United States Patent
Kawato

(10) Patent No.: US 7,479,400 B2
(45) Date of Patent: Jan. 20, 2009

(54) METHOD OF MANUFACTURING SEMICONDUCTOR LASER ELEMENT BY FORMATION AND REMOVAL OF RIDGE PART PROTRUSION

(75) Inventor: Shinichi Kawato, Kashiwara (JP)

(73) Assignee: Sharp Kabushiki Kaisha, Osaka (JP)

( * ) Notice: Subject to any disclaimer, the term of this patent is extended or adjusted under 35 U.S.C. 154(b) by 409 days.

(21) Appl. No.: 11/183,296

(22) Filed: Jul. 14, 2005

(65) Prior Publication Data

US 2006/0014311 A1    Jan. 19, 2006

(30) Foreign Application Priority Data

Jul. 15, 2004    (JP)    ............... 2004-208765

(51) Int. Cl.
*H01L 21/00*    (2006.01)
(52) U.S. Cl. .......................... 438/40; 438/39
(58) Field of Classification Search .................. 438/29, 438/47, 22, 39, 40, 41, 42, 43
See application file for complete search history.

(56) References Cited

U.S. PATENT DOCUMENTS

| | | | | |
|---|---|---|---|---|
| 4,878,991 A | * | 11/1989 | Eichelberger et al. | .......... 216/21 |
| 6,002,701 A | * | 12/1999 | Kan et al. | ................. 372/46.01 |
| 6,426,236 B1 | * | 7/2002 | Ishizaka et al. | ............... 438/29 |
| 6,765,944 B2 | | 7/2004 | Yagi et al. | |
| 6,791,117 B2 | * | 9/2004 | Yoshitake et al. | ............. 257/94 |
| 6,870,870 B2 | | 3/2005 | Sakata et al. | |
| 6,999,488 B2 | * | 2/2006 | Tsunoda | ................. 372/46.01 |
| 7,022,539 B2 | * | 4/2006 | Sato et al. | ...................... 438/47 |
| 7,033,854 B2 | * | 4/2006 | Morita | ........................ 438/40 |
| 2002/0072139 A1 | * | 6/2002 | Kashiwabara | ................ 438/29 |
| 2002/0187577 A1 | * | 12/2002 | Sakata et al. | .................. 438/39 |
| 2006/0094141 A1 | * | 5/2006 | Tsunoda et al. | ............... 438/22 |

FOREIGN PATENT DOCUMENTS

| | | | |
|---|---|---|---|
| JP | 59025277 A | * | 2/1984 |
| JP | 10-190144 A | | 7/1998 |
| JP | 2002-206873 | * | 7/2002 |
| JP | 2003-069154 A | | 3/2003 |
| JP | 2003-347674 A | | 12/2003 |
| JP | 2004-055587 A | | 2/2004 |

* cited by examiner

*Primary Examiner*—Marcos D. Pizarro
*Assistant Examiner*—Eva Montalvo
(74) *Attorney, Agent, or Firm*—Morrison & Foerster LLP

(57) ABSTRACT

A method of manufacturing a semiconductor laser element having an enhanced yield ratio is provided. The semiconductor laser element having a cladding layer, an intermediate layer, and a capping layer is manufactured as follows. At the laminating step, a plurality of lamination layers are laminated in a laminating direction. Subsequently, at protruding step, a cladding layer, a capping layer and a precursor of an intermediate layer are formed so that widthwise lengths of the cladding layer and the capping layer become shorter or uniform in the laminating direction, and so that the precursor of an intermediate layer protrudes widthwise from the cladding layer and the capping layer. At removing step, an protrusion of the precursor of the intermediate layer is removed.

5 Claims, 14 Drawing Sheets

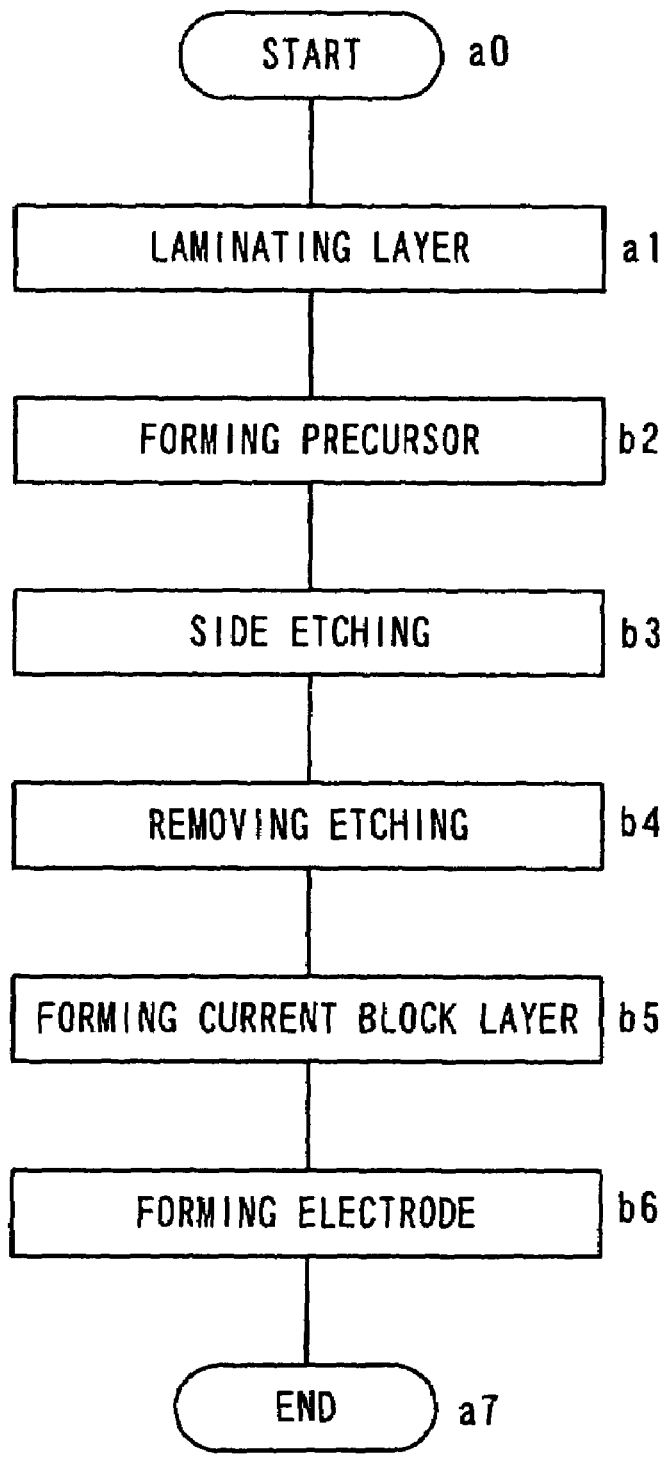

METHOD OF MANUFACTURING SEMICONDUCTOR LASER ELEMENT BY FORMATION AND REMOVAL OF RIDGE PART PROTRUSION

CROSS-REFERENCE TO RELATED APPLICATION

This application claims priority to Japanese Patent Application No. JP 2004-208765, which was filed on Jul. 15, 2004, and the contents of which are incorporated herein by reference, in their entirety.

BACKGROUND OF THE INVENTION

1. Field of the Invention

The present invention relates to a method of manufacturing a semiconductor laser element having a ridge part.

In the invention, a "lamination layer" means a layer to be laminated to form a semiconductor laser element, a "width direction" is used synonymously with a direction perpendicular to a laminating direction in which lamination layers are laminated and an extending direction of the ridge part. A "widthwise length" is used synonymously with a length in width direction.

2. Description of the Related Art

A semiconductor laser element is used as a light source for reading and writing information from and on an optical recording medium. For instance, a red semiconductor laser element is used for optical pickup to read and write information from and to a digital versatile disc (DVD). A higher laser beam output is desired to the semiconductor laser element being thus used as the light source in order to realize a higher writing speed on the optical recording medium. It is also desired that the semiconductor laser element be provided with a high temperature operating performance which allows the semiconductor laser element to operate even in an environment at high temperature brought by an increasing output of the laser beams.

FIG. 9 is a cross sectional view showing a semiconductor laser element 1 of a first related art. A semiconductor laser element 1 realizes the increasing output of the laser beams and a high temperature operating performance. A method of manufacturing the semiconductor laser element 1 will be described below. An n-type substrate 2, an n-type cladding layer 3, an active layer 4, a p-type cladding layer 5, an intermediate layer 6, and a p-type capping layer 7 are sequentially laminated in a laminating direction. A stripe-shaped ridge part 8 is formed by etching a part of the p-type capping layer 7, the intermediate layer 6, and the p-type cladding layer 5 from one side in the laminating direction by use of a wet etching. A compound semiconductor structure 9 having the ridge part 8 is thus formed. A dielectric film 10 is laminated so as to coat a remaining part of the compound semiconductor structure not involving a surface part of the ridge part 8, which faces the laminating direction, and then a p-type electrode 11 is disposed. Further, an n-type electrode 12 is disposed so as to coat the compound semiconductor structure. Thus manufactured is the semiconductor laser element 1 which realizes the increase of the output laser beams and the high temperature operating performance (for instance, refer to Japanese Unexamined Patent Publication JP-A 2003-347674 (pages 3 to 5 and FIG. 2)).

FIG. 10 is a cross sectional view showing a semiconductor laser element 13 of a second related art. Similarly to the semiconductor laser element 1 of the first related art, the semiconductor laser 13 comprises: a compound semiconductor structure 15 having a ridge part 14; an n-type current block layer 17 laminated on a p-type cladding layer 16 so as to coat a remaining part not involving a surface part of the ridge part 14, which faces the laminating direction; a p-type electrode 18 formed on one side in a laminating direction; and an n-type electrode 19 formed on the other side in a laminating direction. In the ridge part 14 of the semiconductor laser element 13, an intermediate layer 20 and a p-type capping layer 21 are formed so as to protrude in a form of window roof in a width direction. The ridge part 14 is thus provided with a window roof part 22 which protrudes in the width direction (for instance, refer to Japanese Unexamined Patent Publication JP-A 2003-069154 (FIG. 4)).

FIG. 11 is a cross sectional view showing the semiconductor laser element 1 of the first related art in a state of having a void inside thereof. In the semiconductor laser element 1 of the first related art, the ridge part 8 is formed by the wet etching. This makes it impossible to form a uniform width of the ridge part as shown in FIG. 9. In practice, as shown in FIG. 11, the intermediate 6 and the p-type capping layer 7 protrude in the width direction so that a window roof part 23 which protrudes in the width direction is formed. When the dielectric layer 10 and an electrode are disposed in a state where the window roof 23 is thus formed, the window roof 23 prevents the dielectric layer 10 and the p-type electrode 11 from being laminated in a region on the other side of the window roof part 23 in a laminating direction so that the dielectric layer 10 and the p-type electrode 11 cannot be disposed so as to have desired layer thicknesses. In addition, due to a variation of the layer thickness, a void 24 is formed between the dielectric layer 10 and the p-type electrode 11. Such variation of the layer thickness and a layer discontinuity by the void formed between the layers incur variation of an element's characteristic of the semiconductor laser element 1. Furthermore, a heat radiation characteristic is largely lowered by forming the void 24 inside the semiconductor laser element 1. This makes the semiconductor laser element 1 be forced to operate at high temperature. Therefore, a large thermal stress acts on the semiconductor laser element 1 and a crystal defect occurs. As a result, there arise troubles such as an increase of operating current and an occurrence of kink.

In the semiconductor laser element 13 of the second related art, the window roof part 22 is formed on the ridge part 14 and therefore, there arises troubles such as the increase of operating current and the occurrence of kink which are similar to the troubles of the semiconductor laser element of the first related art. The applicant has been trying to prevent the element's characteristic from deteriorating by adjusting a width of the window roof part, but the void is still not prevented from occurring. Consequently, by merely adjusting the width of the window roof part 22 of the semiconductor laser element 13, the heat radiation characteristic cannot be prevented from deteriorating and it is difficult to improve the operating performance at high temperature.

SUMMARY OF THE INVENTION

An object of the invention is to provide a method of manufacturing a semiconductor laser element having an enhanced yield ratio.

The invention provides a method of manufacturing a semiconductor laser element having a ridge part comprising a cladding layer, a capping layer and an intermediate layer therebetween, the method comprising:

a laminating step of laminating a plurality of lamination layers on a semiconductor substrate in a laminating direction;

a protruding step of forming, after the laminating step, a cladding layer, a capping layer, and a precursor of an intermediate layer so that widthwise lengths of the cladding layer and the capping layer become shorter or uniform with the advance in the laminating direction, and the precursor of the intermediate layer protrudes widthwise from the cladding layer and the capping layer; and a removing step of removing the protrusion of the precursor of the intermediate layer to form a compound semiconductor multilayer structure.

According to the invention, the plurality of lamination layers are laminated in the laminating direction at the laminating step. Subsequently, at the protruding step, the cladding layer and the capping layer are formed so that widthwise lengths of the cladding layer and the capping layer become shorter with the advance in the laminating direction, and the precursor of the intermediate layer is formed so as to protrude widthwise from the cladding layer and capping layer. Further, at the removing step, the protrusion of the precursor of the intermediate layer is removed to form the compound semiconductor multilayer structure. This makes it possible to manufacture the semiconductor laser element having the ridge part comprising the cladding layer, the intermediate layer and the capping layer.

According to the invention, the protrusion is positively formed on the precursor of the intermediate layer at the protruding step, and then the protrusion is removed at the removing step so that the intermediate layer is formed. That is to say, the protrusion is formed so as to protrude widthwise from the cladding layer and capping layer and therefore, this makes it easy to remove the protrusion at the removing step. In addition, the cladding layer and the capping layer are formed so as to have shorter or uniform widthwise lengths with the advance in the laminating direction and therefore, the following effects are obtained at the step after the removing step.

To the exposed part (referred to as a ridge part or the like) including at least the ridge part, lamination layers are closely attached. In other words, it is made possible to manufacture the semiconductor laser element without forming a void between the ridge part or the like and the lamination layers. Besides, by removing the protrusion of the precursor of the intermediate layer it is made possible to prevent layers further laminated on the compound semiconductor multilayer structure in the laminating direction from having uneven layer thickness attributed to the protrusion. Consequently, the lamination layers further laminated can have substantially uniform layer thickness.

Therefore, according to the manufacturing method of the invention, it is made possible not only to manufacture the semiconductor laser element without forming a void between the ridge part or the like and the lamination layers, but also to prevent the layer from having the uneven layer thickness. Therefore, it is made possible to enhance heat radiation characteristics of the semiconductor laser element, and inhibit occurrence of a crystal defect. This can realize the semiconductor laser element having an enhanced yield ratio.

Further, in the invention, it is preferable that the removing step is followed by a coating step of coating the compound semiconductor multilayer structure with an insulating layer.

According to the invention, the compound semiconductor multilayer structure is coated with the insulating layer at a coating step after the removing step. This makes it possible to coat the compound semiconductor multilayer structure with the insulating layer.

According to the invention, the protrusion is removed at the removing step and then, the compound semiconductor multilayer structure is coated with the insulating layer. At the time, the insulating layer is closely attached to the ridge part. This allows the semiconductor laser element manufactured by the manufacturing method of the invention to have no void inside thereof and therefore, the heat characteristics of the semiconductor can be improved and the occurrence of the crystal defect can be inhibited.

Further, in the invention, it is preferable that the protrusion is composed of a first removing region to be removed, and a second removing region which is to be removed in coordination with the first removing region.

According to the invention, at the protruding step the protrusion is formed such that the first removing region can be removed, and the second removing region can be removed in coordination with the first removing region.

According to the invention, by forming the first removing region to be removed, and the second removing region to be removed in coordination with the first removing region, it is possible to prevent a remaining part of the protrusion, which cannot be removed, from being formed when the protrusion is being removed at the removing step. That is, by forming the protrusion composed of the first and second removing regions, the protrusion can be reliably removed from the precursor of the intermediate layer so that the intermediate layer can be formed. This can realize to manufacture the semiconductor laser element having the ridge part which has a continuously or gradually shorter widthwise length along the laminating direction, or has a uniform widthwise length.

Further, in the invention, it is preferable that the protruding step including:

a precursor forming step of forming each precursor of the capping layer, intermediate layer, and cladding layer by etching; and a side etching step of performing a side etching on each precursor of the cladding layer and capping layer so that the precursor of the intermediate layer is formed so as to protrude widthwise from the cladding layer and capping layer.

According to the invention, the precursor forming step and the side etching step are included in the protruding step. At the precursor forming step, each precursor of the capping layer, intermediate layer, and cladding layer can be formed by etching. At the side etching step, a side etching is performed on each precursor of the cladding layer and capping layer which is formed at the precursor forming step so that the precursor of the intermediate layer can be formed so as to protrude widthwise from the cladding layer and capping layer. It is thus possible at the protruding step to form the ridge part which has the protrusion protruding in the width direction.

According to the invention, by precursor forming step and side etching step, it is possible to form the ridge part in which the precursor of the intermediate layer relatively overhangs in the width direction over the cladding layer and the capping layer. This can realize to form, at the protruding step, the ridge part in which the precursor of the intermediate layer relatively overhangs in the width direction over the cladding layer and the capping layer.

Further, in the invention, it is preferable that the intermediate layer is formed so as to have enough layer thickness to inject holes from the capping layer into the cladding layer.

According to the invention, the intermediate layer is formed so as to have enough layer thickness to inject the holes from the capping layer into the cladding layer and therefore, it is possible to buffer a barrier formed by bonding the capping layer and cladding layer which have different forbidden bands so as to reduce an element resistance of the semiconductor laser element, and manufacture the semiconductor laser element in which an operating current can be reliably flowed from the capping layer to the cladding layer through the intermediate layer so that the yield ratio can be enhanced.

Further, in the invention, it is preferable that, at the removing step, the protrusion is removed by applying ultrasonic vibration to the precursor of the compound semiconductor multilayer structure.

According to the invention, at the removing step, the protrusion is removed by applying the ultrasonic vibration to the precursor of the compound semiconductor multilayer structure.

According to the invention, the protrusion can be removed only by giving the ultrasonic vibration to the precursor of the compound semiconductor multilayer structure and therefore, it is easy to remove the protrusion.

BRIEF DESCRIPTION OF THE DRAWINGS

Other and further objects, features, and advantages of the invention will be more explicit from the following detailed description taken with reference to the drawings wherein:

FIG. 7 is a flowchart showing steps of manufacturing the semiconductor laser element;

DETAILED DESCRIPTION OF THE PREFERED EMBODIMENTS

Figure 1:
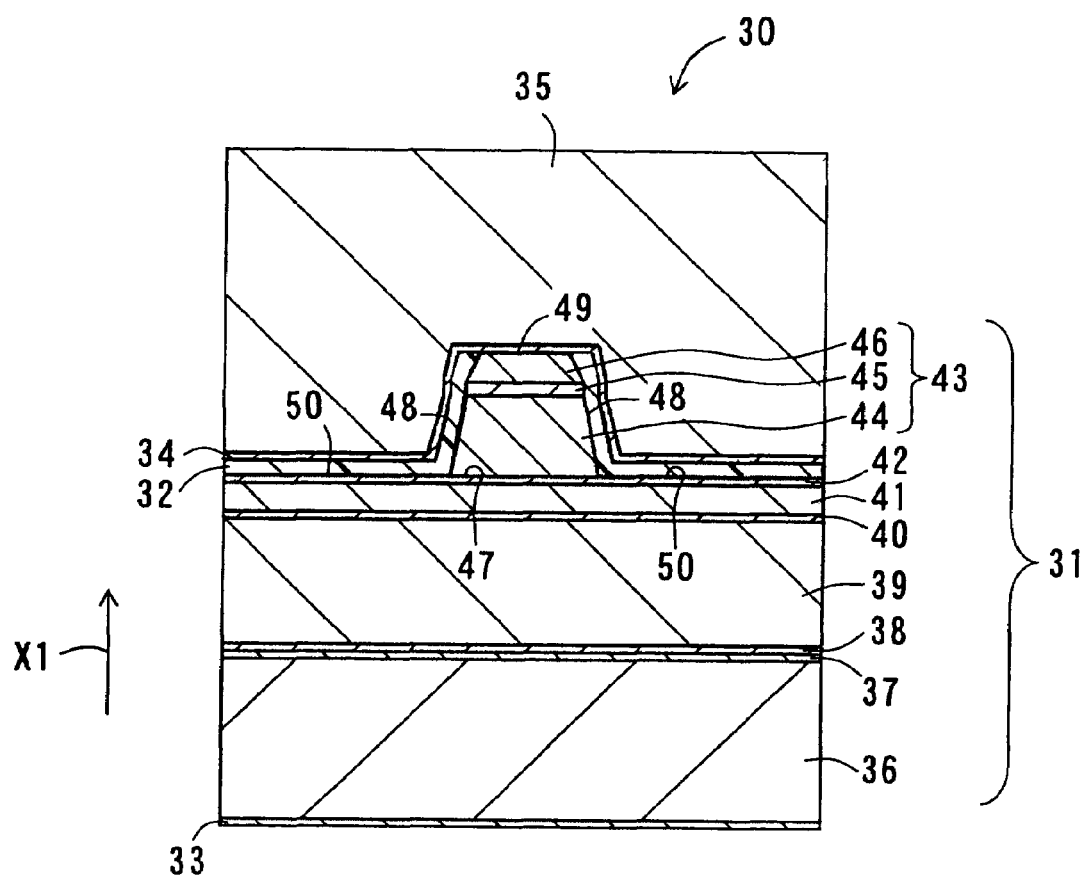
FIG. 1 is a cross sectional view showing a semiconductor laser element which is manufactured by a method of manufacturing a semiconductor laser element according to a first embodiment of the invention.

Now referring to the drawings, preferred embodiments of the invention are described below.

FIG. 1 is a cross sectional view showing a semiconductor laser element 30 which is manufactured by a method of manufacturing a semiconductor laser element according to a first embodiment of the invention. The semiconductor laser element 30 is constituted so that a laser beam can be emitted when an electric current is flowed in a forward direction, and used, for instance, for optical pickup. The semiconductor laser element 30 comprises a compound semiconductor multilayer structure 31, a current block layer 32, an n-type electrode 33, a p-type electrode 34, and a gold overlaid layer 35.

The compound semiconductor multilayer structure 31 is constituted so that a first buffer layer 37, a second buffer layer 38, a first cladding layer 39, an active layer 40, a second cladding layer 41, and an etching stop layer 42 which is provided with a ridge part 43 are sequentially laminated on a substrate 36 in a laminating direction X1. The semiconductor substrate 36 as a semiconductor substrate is constituted so that a plurality of lamination layers can be laminated thereon and an ohmic contact with the n-type electrode 33 can be provided. The substrate 36 is formed of, for instance, an n-type gallium arsenide (GaAs) and so as to have a layer thickness of 100 μm. The first buffer layer 37 as a lamination layer is provided for lattice matching of the substrate 36 and first cladding layer 39 which have different lattice intervals in coordination with the second buffer layer 38. The first buffer 37 is formed of, for instance, the n-type GaAs and so as to have a layer thickness of 0.25 μm. The second buffer layer 38 as a lamination layer is provided for the lattice matching of the substrate 36 and the first cladding layer 37 which have different lattice intervals in coordination with the first buffer layer 37. The second buffer 38 is formed of, for instance, an n-type gallium indium phosphorus (GaInP) and so as to have a layer thickness of 0.25 μm.

The first cladding layer 39 and the second cladding layer 41 as lamination layers are formed of semiconductors having larger forbidden bands than the active layer 40, and provided for confining carriers to the active layer 40. The first cladding layer 39 is an n-type cladding layer and formed of, for instance, an n-type aluminum gallium indium phosphorus (AlGaInP) and so as to have a layer thickness of 2.4 μm. The second cladding layer 41 is a p-type cladding layer and formed of, for instance, a p-type aluminum gallium indium phosphorus and so as to have a layer thickness of 0.5 μm. The active layer 40 as a lamination layer is constituted so that electrons and holes as carriers to be confined are radiatively recombined and then, a laser beam generated by the radiative recombination can be amplified to output outward. The active layer 40 is constituted by, for instance, a multi quantum well (abbreviated as MQW) and so as to have a layer thickness of 0.1 μm. The etching stop layer 42 as a lamination layer is provided in order to prevent the second cladding layer 41 from having an etching performed thereon when the etching is being performed. The etching stop layer 42 is formed of, for instance, a p-type GaInP and so as to have a layer thickness of 0.1 μm.

The ridge part 43 is disposed on a middle part of a surface part 47 in the width direction, which faces the laminating direction X1 of the etching stop layer 42, and shaped in a strip extending in a longitudinal direction. The ridge part 43 is formed so that a widthwise length thereof is shorter than that of the etching stop layer 42 and gradually shorter along the laminating direction X1. The ridge part 43 is formed so as to have a substantially trapezoid cross section seen as cut by a virtual plane perpendicular to the longitudinal direction. The ridge part 43 is provided for concentrating the carriers on one part in the width direction and injecting the carriers into the active layer 40. The ridge part 43 is formed by sequentially laminating a third cladding layer 44, an intermediate layer 45, and a capping layer 46.

The third cladding layer 44 as a cladding layer is formed so as to have a continuously shorter width along the deposing direction X1. Specifically, the third cladding layer 44 is formed so as to have both widthwise side parts thereof inclined to and facing the laminating direction X1. The third cladding layer is formed of a semiconductor having a large forbidden band than the active layer 40 for confining beams in the active layer 40 as in the case of the second cladding layer. The third cladding layer 44 thus formed is formed of, for instance, the p-type AlGaInP and so as to have a layer thickness of 1.2 μm. The intermediate layer 45 is formed so as to have a uniform widthwise length and both the widthwise side parts substantially parallel to the laminating direction X1.

The meaning of the language "substantially parallel" includes the meaning of the language "parallel". The intermediate layer 45 is provided for buffering a barrier formed between the third cladding layer 44 and the capping layer 46 which have different forbidden bands, that is for buffering discontinuity of the forbidden bands. The intermediate layer 45 is formed of, for instance, the p-type GaInP and so as to have a layer thickness of 0.03 μm. The capping layer 46 is formed so as to have a continuously shorter width along the laminating direction X1. Specifically, the capping layer 46 is formed so as to have the widthwise side parts thereof inclined to and facing the laminating direction X1. The capping layer 46 is provided for the ohmic contact with the p-type electrode 34. The capping layer 46 thus formed is formed of, for instance, the p-type GaAs and so as to have a layer thickness of 1.2 μm.

The third cladding layer 44 and the capping layer 46 are formed so as to have a surface part, which faces the intermediate layer 45, of the substantially same shape as a surface part of the intermediate layer 45 perpendicular to the laminating direction X1. This allows the ridge part 43 to have widthwise surface parts 48 continuously formed by the third cladding layer 44, the intermediate layer 45, and the capping layer 46. The ridge part 43 is formed so that both the widthwise surface parts 48 faces or is substantially parallel to the laminating direction X1, in other words, so as to have a gradually shorter width.

On a surface part of the compound semiconductor multilayer structure facing the laminating direction X1, a current block layer 32 which is a thin film is laminated so as to coat a remaining part 50 (occasionally referred to as "a current block layer coating part" hereinbelow) not involving a surface part 49 (occasionally referred to as "a ridge exposed surface part") of the ridge part, which faces the laminating direction X1. The current block layer 32 as an insulating layer is closely laminated on both the widthwise surface parts 48 without forming a void between both the widthwise surface parts of the ridge part 43 and the current block layer 32. The current block layer 32 is formed of an insulating material so as to prevent an electric current from flowing from undesired position to the ridge part 43 and etching stop layer 42, for concentrating the carriers on the ridge part 43. The current block layer 32 is formed of, for instance, silicon oxide ($SiO_2$) and so as to have a thickness of 0.2 μm.

On the substrate 36, the n-type electrode 33 which is a thin film is laminated so as to coat the other surface parts confronting one surface part on which the first buffer layer 37 of the substrate 36. The n-type electrode 33 is constituted so as to provide the ohmic contact with the substrate 36, and disposed so as to flow an electric current to the compound semiconductor multilayer structure 31 in coordination with the p-type electrode 34. On the ridge exposed surface part 49 and the current block layer 32, the p-type electrode 34 which is a thin film is disposed so as to coat the ridge exposed surface part 49 and the current block layer 32. The p-type electrode 34 is constituted so as to provide the ohmic contact with the capping layer 46, and disposed so as to flow an electric current to the compound semiconductor multilayer structure 31 in coordination with the n-type electrode 33. On the p-type electrode 34, the gold overlaid layer 35 is disposed so as to coat the p-type electrode 34. The gold overlaid layer 35 is formed of, for instance, gold and disposed for preventing the p-type electrode 34 from being oxidized and radiating heat generated inside the semiconductor laser element 30, especially the active layer 40. For this reason, the gold overlaid layer 35 is formed so as to be thicker than other lamination layers to enhance a radiation characteristic. The gold overlaid layer 35 protects the ridge part 43 from mechanical or thermal impact from outside so that a treatment becomes easy when the semiconductor laser element 30 is being mounted on the substrate. The current block layer 32, the p-type electrode 34, and the gold overlaid layer 35 which are thus formed are disposed so closely each other that a void is not formed therebetween.

The semiconductor laser element 30 thus formed has the carriers which are guided to the active layer 40 when a bias is applied in a forward direction, and then radiantly recombined on the active layer 40 so that a laser beam is emitted. The laser beam is amplified inside the active layer 40 and outputted from one side of a resonance direction as the longitudinal direction, that is, the laser beam is emitted. The semiconductor laser element 30 is a so-called real refractive index waveguide type semiconductor laser element provided with the current block layer 32 and the ridge part 43 and therefore, the carriers to be injected can be topically concentrated on the active layer. This allows the semiconductor laser element 30 to emit a higher-power laser beam. The high-power laser beam is thus emitted and then, the active layer 40 as a light emitting part generates heat with radiatively recombination and non-radiatively recombination. The semiconductor laser element 30 radiates heat by transmitting thus generated heat to the gold overlaid layer 35 through each lamination layer having good thermal conductance. This makes it possible to inhibit heat stagnation in the active layer 40 as a light emitting part and troubles caused by the heat stagnation, such as a crystal defect. Therefore, it is possible to inhibit an increase of operating current so that the semiconductor laser element 30 can be made to fulfill a desired function. Furthermore, the semiconductor laser element 30 has the current block layer 32 and the ridge part 43 laminated so closely each other that a void is not formed therebetween and therefore, a thermal conduction to each lamination layer is prevented from being impeded due to air having a lower thermal conductance than each lamination layer. This further enhances a characteristic of heat radiation of the semiconductor laser element 30. In addition, the intermediate layer 45 buffers a barrier formed between the third cladding layer 44 and the capping layer 46 which have different forbidden bands and therefore, it is possible to prevent troubles such that a current does not flow between one end and another end of the laminating direction X1, or that the element resistance of the semiconductor laser element 30 increases. A method of manufacturing such semiconductor laser element 30 will be described hereinbelow.

Figure 2:
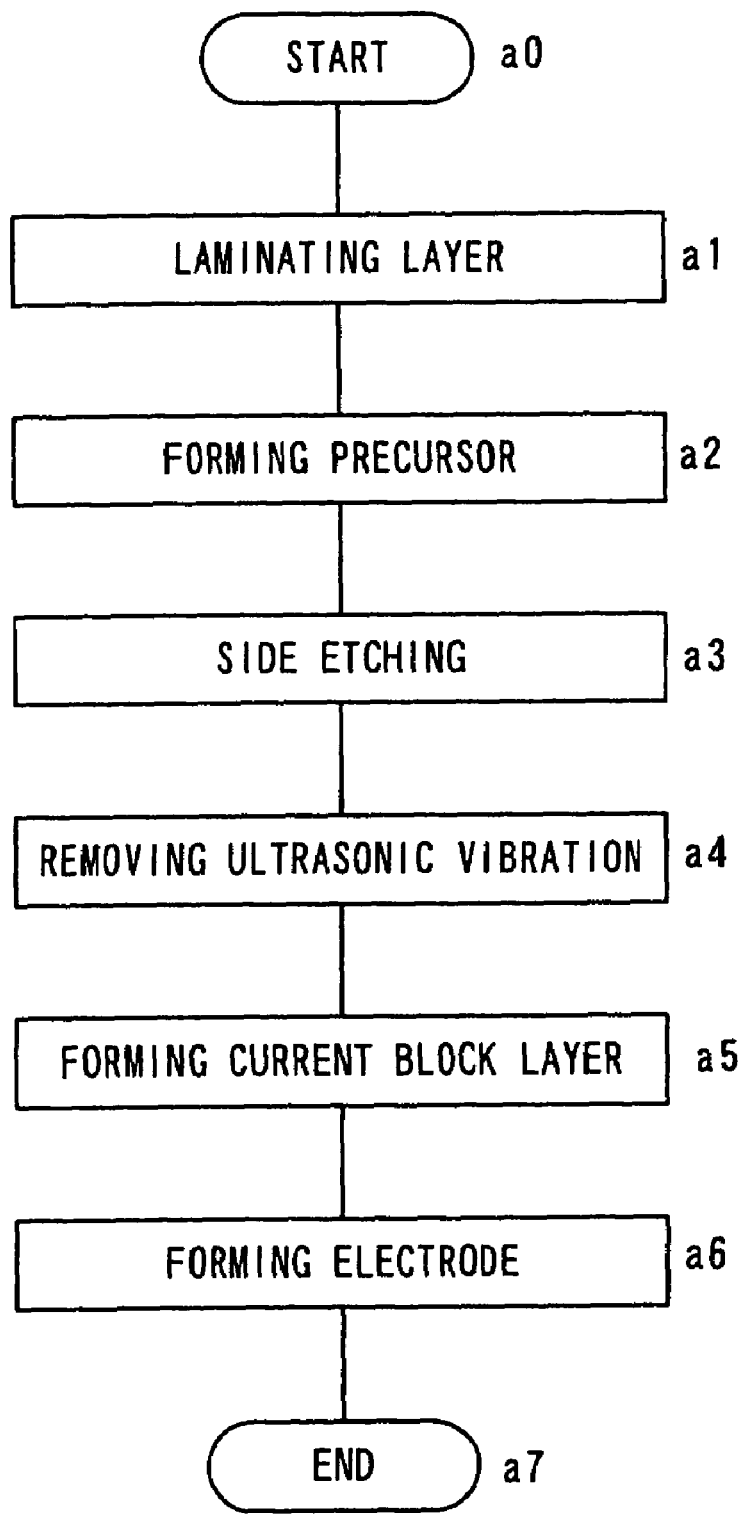
FIG. 2 is a flow chart gradually showing steps of manufacturing the semiconductor laser element.
Figure 3A:
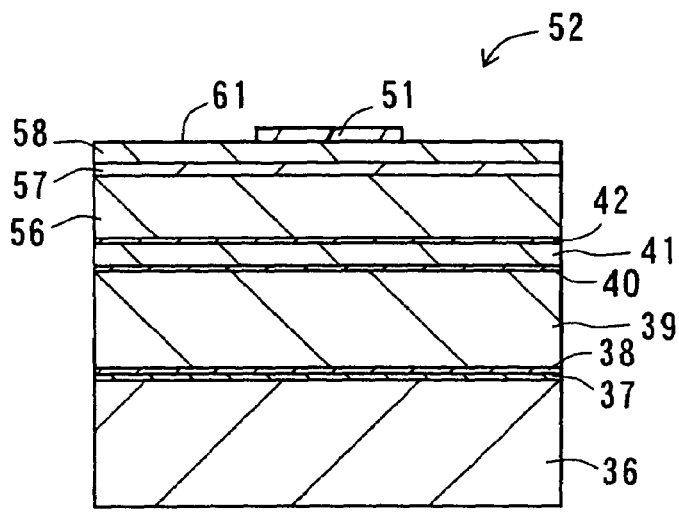
FIGS. 3A to 3G are cross sectional views gradually showing steps of manufacturing the semiconductor laser element.
Figure 3B:
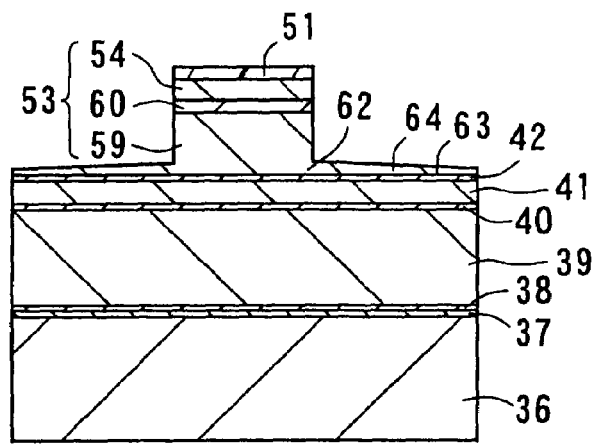
Figure 3C:
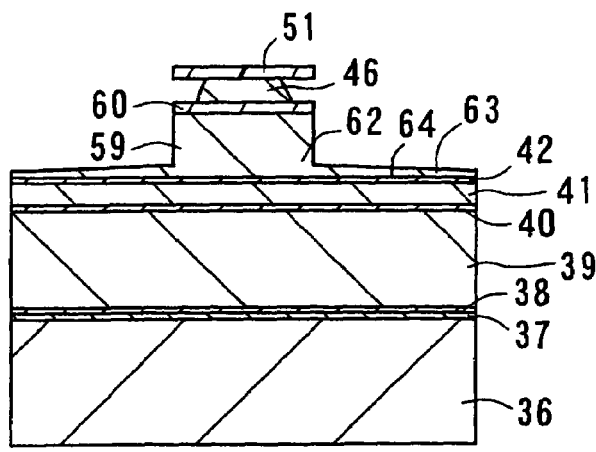
Figure 3D:
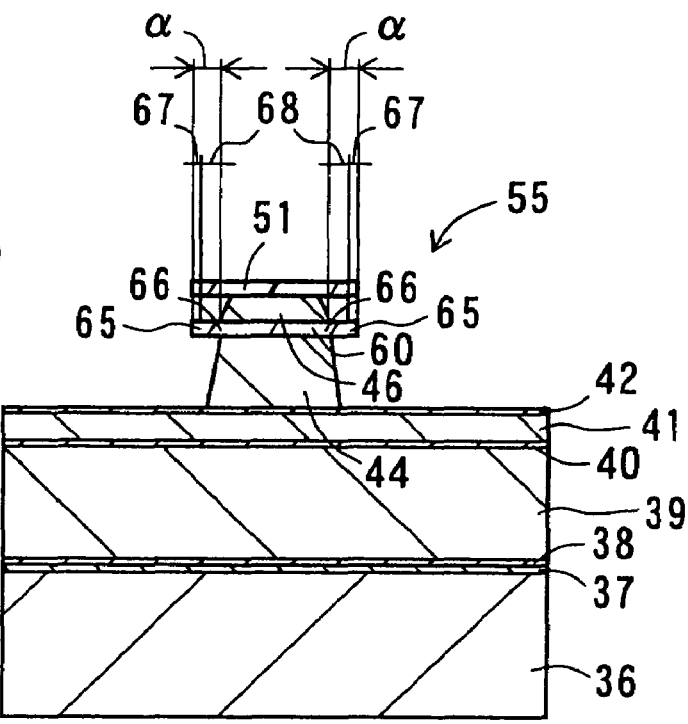
Figure 3E:
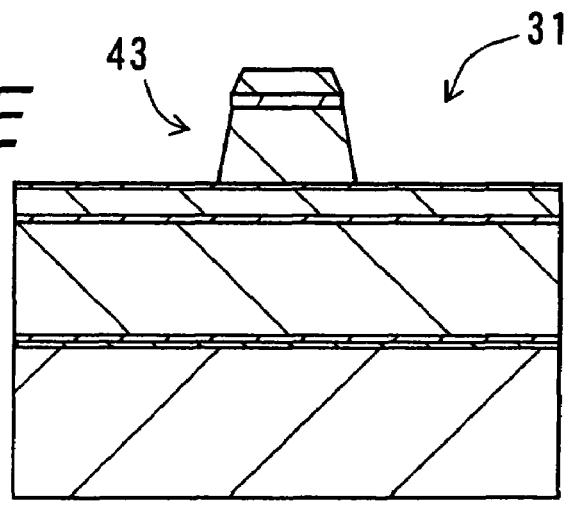
Figure 3F:
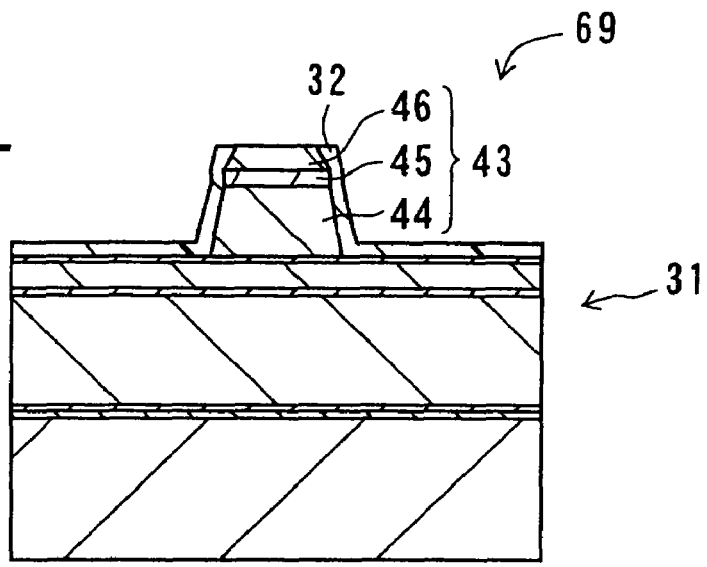
Figure 3G:
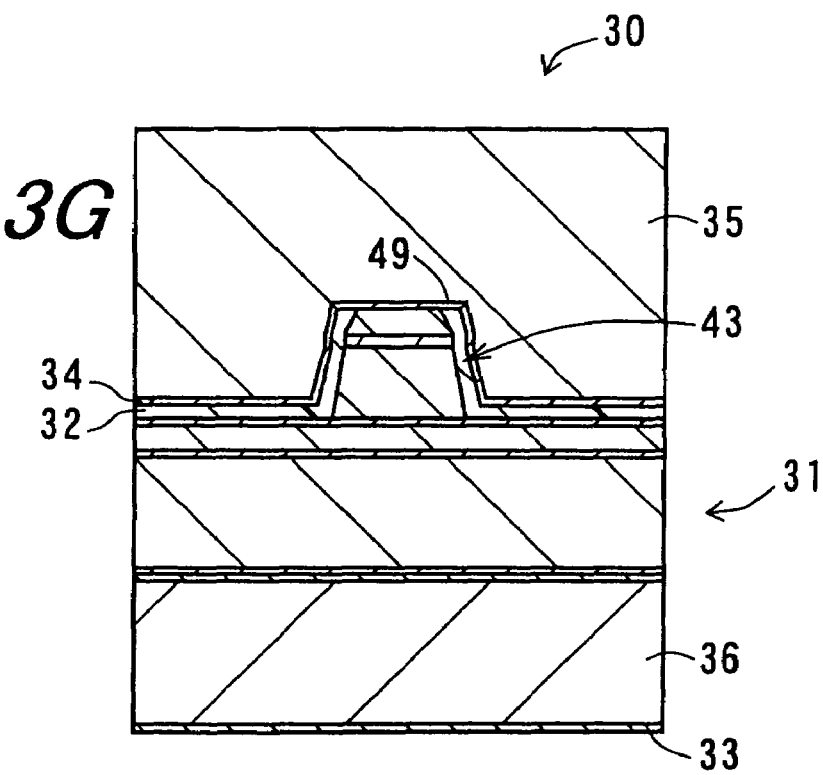
Figure 4:
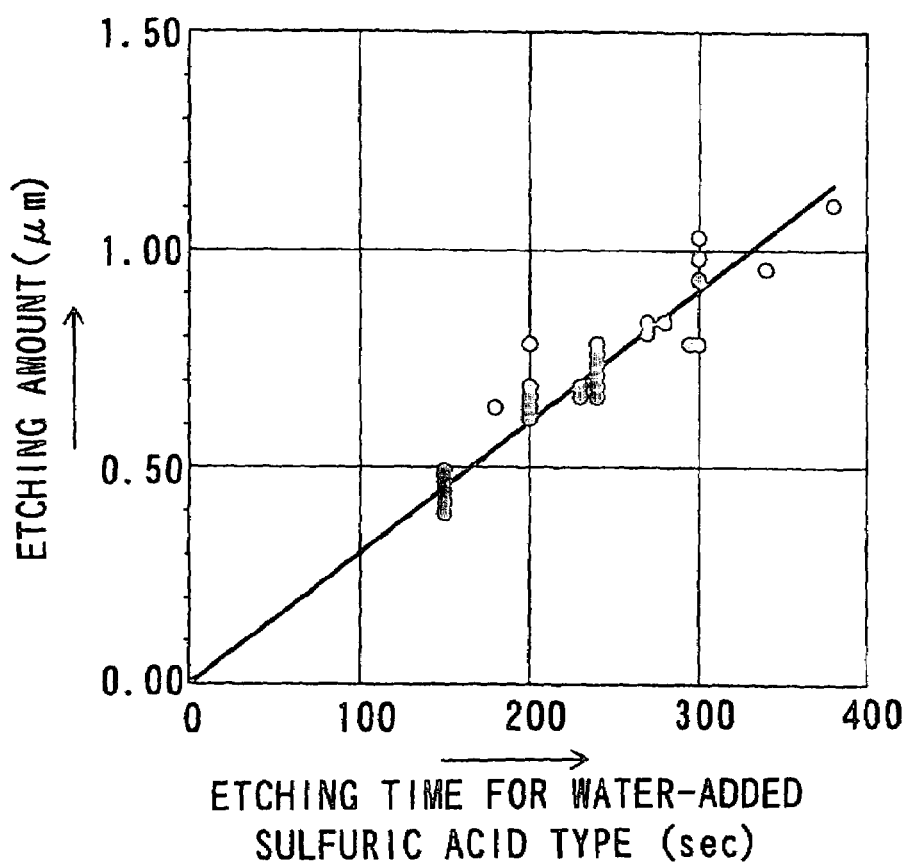
FIG. 4 is a graph showing an etching speed by an etchant of water-added sulfuric acid type.

FIG. 2 is a flow chart gradually showing steps of manufacturing a semiconductor laser element 30. FIGS. 3A to 3G are cross sectional views gradually showing steps of manufacturing the semiconductor laser element 30. The FIG. 3A is a cross sectional view showing a multilayered lamination layer structure 52 having an etching mask 51 formed therein. The FIG. 3B is a cross sectional view showing a multilayered lamination layer structure in a state where a precursor 53 of the ridge part is formed. The FIG. 3C is a cross sectional view showing a multilayered lamination layer structure in a state where a side etching is performed on a precursor 54 of the capping layer. The FIG. 3D is a cross sectional view showing a precursor 55 of the compound semiconductor multilayer structure. The FIG. 3E is a cross sectional view showing a compound semiconductor multilayer structure 31. The FIG. 3F is a cross sectional view showing a compound semiconductor multilayer structure 31 having a current block layer 32 laminated thereon. The FIG. 3G is a cross sectional view showing the semiconductor laser element 30. The FIG. 4 is a graph showing an etching speed by an etchant of water-added sulfuric acid type. The manufacturing steps of the manufacturing method of the semiconductor laser element includes a laminating step, a precursor forming step, a side etching step, an ultrasonic vibration removing step, a current block forming step, and an electrode forming step. The manufacturing steps of the semiconductor laser element starts when a substrate 36 is mounted on a metal organic vapor phase epitaxy (abbreviated as MOVPE) apparatus (not shown), and step a0 proceeds to step a1.

At step a1 as the laminating step, on the substrate 36 mounted on the MOVPE apparatus, laminated are a first buffer layer 37, a second buffer layer 38, a first cladding layer 39, the active layer 40, the second cladding layer 41, the etching stop layer 42, a third cladding layer 56, an intermediate layer 57, and a capping layer 58 by sequentially making crystal growth thereof in the laminating direction X1 by means of the MOVPE method. The third cladding layer 56 is a lamination layer from which a precursor 59 of the third cladding layer and the third cladding layer 44 formed by an etching treatment. The intermediate layer 57 is a lamination layer from which a precursor 60 of the intermediate layer and the intermediate layer 45 by the etching treatment. The capping layer 58 is a lamination layer from which a precursor 54 of the capping layer and the capping layer 46 by the etching treatment. The intermediate layer 57 is disposed for buffering the discontinuity of the forbidden band between the third cladding layer 56 and the capping layer 58. In this case, when a layer thickness of the intermediate layer 57 is too thin, the intermediate layer cannot achieve a buffering effect of the discontinuity of the forbidden band between the third cladding layer 56 and the capping layer 58. Consequently, a barrier formed between the third cladding layer 56 and the capping layer 58 is made to be so high that it is made to be difficult for the holes to be injected from the third cladding layer 56 to the capping layer 58. In order to show such a buffering effect of the discontinuity of the forbidden band, it is desired that the intermediate layer 57 has a layer thickness of 0.02 µm or more. In addition, as described hereinbelow, it is desired that the intermediate layer 57 has a layer thickness of 0.05 µm or less. Thus, a plurality of the lamination layers are laminated, and the multilayered lamination layer structure 52 is formed. After the multilayered lamination layer structure 52 is formed, step a1 proceeds to step a2.

At step a2 as a precursor forming step, on the multilayered lamination layer structure 52 as shown in FIG. 3A, the etching mask 51 is formed on a surface part 61 (occasionally referred to as "an etching surface part 61" hereinbelow) which faces to the laminating direction X1 by use of lithography. The etching mask 51 is formed on a middle part of the etching surface part 61 in the width direction so as to extend in a longitudinal direction, and disposed for forming the precursor 53 of the ridge part by a dry etching. As a specific method of forming the etching mask 51, a precursor (not shown) of the etching mask 51 is formed on the etching surface part 61 by a plasma chemical vapor deposition (abbreviated as PCVD) method, and then the precursor of the etching mask 51 is processed in pattern by lithography so as to form the etching mask 51. The etching mask 51 is formed, for instance, so as to have a widthwise length of 2.3 µm.

The etching mask 51 is formed and then, a dry etching is performed on the multilayered lamination layer structure 52 by an inductively coupled plasma (as abbreviated as ICP) dry etching method in a direction close to the etching surface part 61 from a position confronting the etching surface part 61 so that the precursor 53 of the ridge part is formed. In this regard, a method is not limited to the ICP etching method, but any method is applicable as long as it is a dry etching. The precursor 53 of the ridge part is generally formed so as to have a substantially cuboid shape which extends in a longitudinal direction. On an end part 62 which confronts the etching stop layer 42 of the precursor 53 of the ridge part, formed is a coating part 64 which is broaden toward the end, that is, which has an increasing thickness from both the widthwise end parts to a middle part of the precursor 53 of the ridge part, and coats a surface part 63 (occasionally referred to as "a ridge part forming surface part 63" hereinbelow) confronting a ridge part of the etching stop layer 42. The precursor 53 of the ridge part comprises precursors 59, 60, and 54 each of the third cladding layer, the intermediate layer, and the capping layer. The precursor 53 of the ridge part is formed on a middle part of the ridge part forming surface part 63 in width direction so as to extend in a longitudinal direction. The precursors 59, 60, and 54 each of the third cladding layer, the intermediate layer, and the capping layer are formed by performing a dry etching on the third cladding layer 56, the intermediate layer 57, and the capping layer 58 each. The precursors 59, 60, and 54 each of the third cladding layer, the intermediate layer, and the capping layer are generally formed so as to have a substantially cuboid shape. The coating part 64 is formed on the end part 62 which confronts the etching stop layer 42 of the precursor 59 of the third cladding layer. Thus the precursor 53 of the ridge part as shown in FIG. 3B is formed and then, step a2 proceeds to step a3.

At step a3 as a side etching step, the precursor 53 of the ridge part is firstly soaked in an etchant bath of sulfuric acid hydrogen peroxide solution type so that the side etching is performed on the precursor 54 of the capping layer from both the widthwise end parts to a middle thereof. The etchant of the sulfuric acid hydrogen peroxide solution type is, for instance, a mixed solution of sulfuric acid, hydrogen peroxide solution, and water. Although it is possible to perform a wet etching on the precursor 54 of the capping layer, it is difficult to perform the wet etching on the precursor 60 of the intermediate layer, the precursor 59 of the third cladding layer, and the etching stop layer 42. The etchant of sulfuric acid hydrogen peroxide solution type has a substantially uniform etching speed as shown in FIG. 4. For instance, the etching speed of GaAs under 12° C. is approximately 0.18 µm/min. In FIG. 4, a vertical axis indicates an etching amount (µm) while a horizontal axis indicates an etching time (sec). Thus the capping layer 46 is formed as shown in FIG. 3C by performing the side etching on the precursor 54 of the capping layer.

Next, the precursor 53 of the ridge part, in which the capping layer 46 is formed, is soaked in an etchant bath of phosphoric acid type so that the side etching is performed on the precursor 59 of the third cladding layer from widthwise end parts to a middle thereof. Since the precursor 59 of the third cladding layer is formed on the ridge part forming surface part 63, the coating part 64 is formed in order to prevent the etchant of phosphoric acid type from performing the wet etching on the etching stop layer when the side etching is being performed on the precursor 59 of the third cladding layer. By providing the coating part 64, it is possible to perform the side etching on the coating part 64 when the side etching is being performed, and end the side etching before the etching stop layer 42 is eroded. This makes it possible to prevent the etchant stop layer 42 from being eroded. The etchant of phosphoric aide type is, for instance, phosphoric acid. Although it is possible to perform the wet etching on the precursor 59 of the third cladding layer, it is difficult to perform the wet etching on the precursor 60 of the intermediate layer, the capping layer 46 and the etching stop layer 42. The etchant of phosphoric acid type has a substantially uniform etching speed. For instance, the etching speed of AlGaInP under 70° C. is 0.3 µm/min or more and 0.5 µm/min or less. By performing the side etching on the precursor 59 of the third cladding layer in this manner, the third cladding layer 44 is formed. Thus the side etching is performed on the third cladding layer 44 and the capping layer 46, and this makes it possible, as shown in FIG. 3D, to form an protrusion 65 in which both the widthwise end parts thereof protrude from the third cladding layer and the capping layer by a protruding amount of α (α=0.15 μm in the embodiment) on the precursor 60 of the intermediate layer on which no etching is performed. It is thus possible to form the precursor 55 of the compound semiconductor multilayer structure in which the protrusion 65 formed by having the precursor 60 of the intermediate layer overhung is provided. The protrusion 65 is formed and then, the etching mask 51 is removed. After the etching mask 51 is removed, step a3 proceeds to step a4. In the embodiment, constituted is the protruding step of forming the protrusion 65, which comprises step a2 as a precursor forming step and step a3 as a side etching step.

At step a4 as a removing step as well as the ultrasonic vibration removing step, an ultrasonic vibration is given to the precursor 55 of the compound semiconductor multilayer structure so that the protrusion 65 is removed. Specifically, the precursor 55 of the compound semiconductor multilayer structure is soaked in a solution inside a bath (not shown) and then, the ultrasonic vibration is given to the bath. This allows the ultrasonic vibration to be given to the precursor 55 of the compound semiconductor multilayer structure through the solution. An adjacent corner part on which the precursor 60 of the intermediate layer is welded to both the widthwise side parts of the capping layer 46 and third cladding layer 44, that is a base part 66 of the protrusion 65, becomes a weak part of the precursor 60 of the intermediate layer in which stress concentration occurs. Therefore, when the ultrasonic vibration is given to the precursor 55 of the compound semiconductor multilayer structure, a crack is made on the base part 66 of the protrusion 65 as a weak part of the precursor 60 of the intermediate layer. The crack occurs on the base part 66 from sides thereof on the third cladding layer 44 and the capping layer 46. As if those cracks are connected each other, the protrusion 65 is broken apart. Such a break makes it possible to form the intermediate layer 45 without leaving the protrusion 65, that is, to form the compound semiconductor multilayer structure 31 as shown in FIG. 3E. Although the protrusion 65 can be removed by having the base part 66 of the protrusion thus broken apart, the protrusion 65 is not made to be broken apart when the widthwise length thereof is short because stress concentration occurred on the base part 66 of the protrusion 65 is small. Consequently, it is necessary for the protrusion 65 to be formed so as to have a longer widthwise length than a prescribed length. In other words, the protrusion 65 needs to be provided with a first region which can be removed and a second removing region 68 which cannot be removed by itself but in coordination with the first removing region 67. By having the first and second removing regions 67 and 68 provided in this manner, it is possible to prevent the protrusion 65 from being in a state of relatively protruding from the capping layer 46 and the third cladding layer 44 by having the first and second removing regions 67 and 68 in coordination. In other words, the protrusion 65 can be removed. Specifically, the protrusion 65 can be provided with the first and second removing regions 67 and 68, and removed when the protruding amount α of the protrusion 65 is 1.0 μm or more. In order to form the intermediate layer 45 having no protrusion 65 left as just described, the protruding amount α needs only to be 1.0 μm or more. In addition, the intermediate layer 57 is laminated at the laminating step so as to have a layer thickness of 0.02 μm or more and 0.05 μm or less and therefore, the intermediate layer 45 is formed so as to have a layer thickness of 0.02 μm or more and 0.05 μm or less. The protrusion 65 is thus removed so that the intermediate layer 45 is formed, that is, the compound semiconductor multilayer structure 31 is formed, and then step a4 proceeds to step a5.

At step a5 as a coating step as well as a current block layer forming step, a precursor (not shown) of the current block layer 32 is laminated so as to coat the current block layer coating part 50 and the ridge exposed surface part 49. The precursor of the current block layer 32 is formed, for instance, by the PCVD method. The precursor of the current block layer 32 is formed so as to face both the widthwise surface parts 48 of the ridge part 43 or substantially parallel to the laminating direction X1 and therefore, the precursor of the current block layer 32 can be closely formed on the ridge part 43 so as to have a substantially uniform layer thickness without variation. In other words, both the widthwise surface parts 48 of the ridge part 43 is not formed so as to have an inverse tapered shape towards the laminating direction X1 and therefore, the precursor of the current block layer 32 can be closely formed on the ridge part 43 so as to have a substantially uniform layer thickness without variation. This makes it possible to form the precursor of the current block layer 32 on the compound semiconductor multilayer structure 31 without forming a void between the ridge part 43 and the precursor of the current block layer 32.

The precursor of the current block layer 32 thus formed has a part, which is formed on the ridge exposed surface part 49 in the laminating direction X1, removed by use of the lithography and buffered hydrofluoric acid so that the current block layer 32 is formed. On the compound semiconductor multilayer structure 31, the current block layer 32 is thus formed so as to coat the current block layer coating part 50, and then a precursor 69 of the semiconductor laser element as shown in FIG. 3F is formed. The current block layer 32 thus formed is closely laminated on the ridge part 43 without forming a void. The precursor 69 of the semiconductor laser element is thus formed and then, step a5 proceeds to step a6.

At step a6 as an electrode forming step, the p-type electrode 34 is provided on the current block layer 32 and ridge exposed surface part 49 of the precursor 69 of the semiconductor laser element. In addition, the n-type electrode 33 is provided on the substrate 36 of the precursor 69 of the semiconductor laser element. Furthermore, the p-type electrode 34 is provided with the gold overlaid layer 35 so as to coat the p-type electrode 34. The p-type electrode 34 and the n-type electrode 33 are formed by evaporating gold. The overlaid gold layer 35 is formed, for instance, by plating crystals which constitute each layer by means of a plating method. In this case, in the p-type electrode 34 and the gold overlaid layer 35, the current block layer 32 is formed on the ridge part 43 formed so as to have the widthwise surface parts 48 which face the laminating direction X1 or so as to be substantially parallel to the laminating direction X1 and therefore, it is possible to have the current block layer 32, the p-type electrode 34, and the gold overlaid layer 35 closely formed each other. In other words, the widthwise surface parts 48 of the ridge part 43 are not formed so as to have an inverse tapered shape towards the laminating direction X1 and therefore, the current block layer 32, the p-type electrode 34, and the gold overlaid layer 35 can be closely formed each other. By providing the precursor 69 of the semiconductor laser element with the p-type electrode 34, the n-type electrode 33, and the gold overlaid layer 35, it is possible to form the semiconductor laser element 30 as shown in FIG. 3G. After the semiconductor laser element 30 is thus formed, step a6 proceeds to step a7 where a manufacture of the semiconductor laser element 30 ends.

Figure 5:
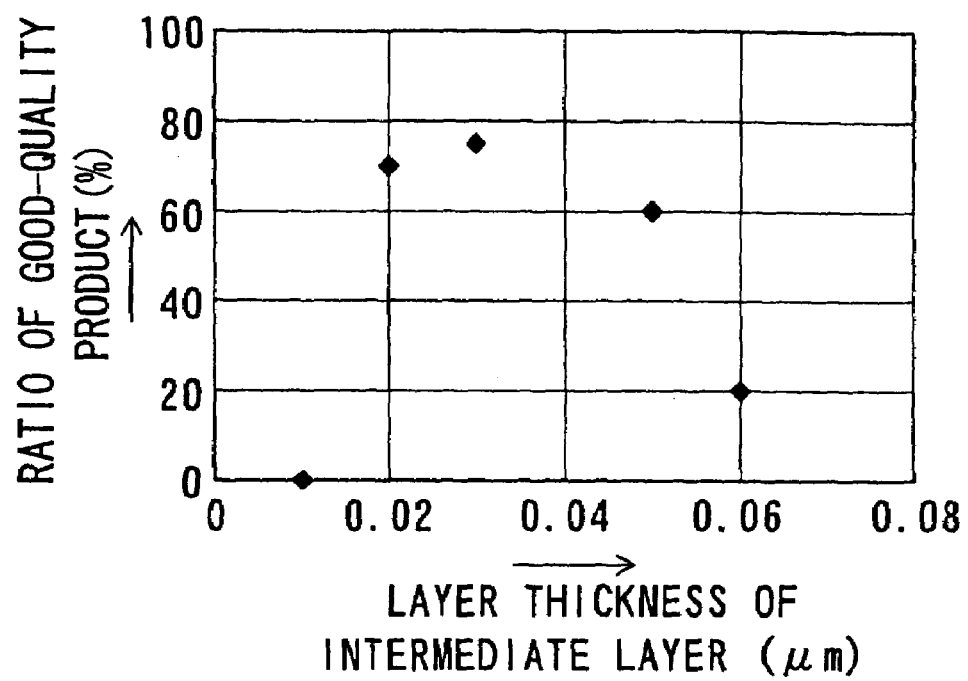
FIG. 5 is a graph showing a ratio of good-quality product of the semiconductor laser element which is manufactured by use of the manufacturing method in the embodiment.

The following effects are gained by manufacturing the semiconductor laser element 30 as described above. FIG. 5 is a graph showing a ratio of good-quality product of the semiconductor laser element 30 which is manufactured by use of the manufacturing method in the embodiment. In this case, the ratio of good-quality product indicates a percentage of quantity of good-quality products of the semiconductor laser element 30 which have a prescribed value or more of high-temperature properties, high-output properties, and stabilities of a radiation angle based on all products of the semiconductor laser element 30 to be manufactured. In FIG. 5, the vertical axis of the graph indicates the ratio of good-quality product while the horizontal axis indicates a layer thickness of the intermediate layer.

According to the manufacturing method of the semiconductor laser element 30 of the embodiment, the protrusion 65 is positively formed on the precursor 60 of the intermediate layer at the protruding step, and then the protrusion 65 is removed at the ultrasonic vibration removing step so that the intermediate layer 60 is formed. That is to say, the protrusion 65 is formed so as to protrude widthwise from the widthwise lengths of the third cladding layer 44 and capping layer 46 and therefore, this makes it easy to remove the protrusion 65 at the ultrasonic vibration removing step. In addition, the third cladding layer 44 and the capping layer 46 are formed so as to have shorter widthwise lengths along the laminating direction X1 or have a uniform widthwise length and therefore, the following effects are gained at a step after the removing step.

The current block layer 32 is closely provided on at least the ridge part 43 and the etching stop layer 42. In other words, it is made possible to manufacture the semiconductor laser element 30 without forming a void between the ridge part 43 and the etching stop layer 42, and the current block layer 32. Besides, the protrusion 65 of the precursor 60 of the intermediate layer is removed so that it is made possible to prevent the layer from having uneven layer thickness attributed to the protrusion 65. Consequently, the current block layer 32 can be laminated so as to have substantially uniform layer thickness in a case where the current block layer 32 is further laminated on the compound semiconductor multilayer structure 31 in the laminating direction X1.

Therefore, according to the manufacturing method of the embodiment, it is made possible not only to manufacture the semiconductor laser element 30 without forming a void between the ridge part 43 and the etching stop layer 42, and the current block layer 32, but also to prevent the layer from having the uneven layer thickness. Therefore, it is possible to enhance a heat radiation characteristic of the semiconductor laser element 30, and inhibit occurrence of a crystal defect.

In addition, the variation of light emitting properties, light emitting outputs, light radiation angles of the semiconductor laser element 30 can be inhibited by inhibiting the occurrence of the variation of layer thickness, discontinuity, and crystal defects. It is thus possible to inhibit the variation of the properties of the semiconductor laser element 30. This can realize the semiconductor laser element 30 having an enhanced yield ratio.

According to the method of manufacturing the semiconductor laser element 30 of the embodiment, the protrusion 65 is removed at the removing step and then, the compound semiconductor multilayer structure 31 is coated with the current block layer 32. At the time, the current block layer 32 is closely provided on the ridge part 43. This allows the semiconductor laser element 30 manufactured by the manufacturing method of the invention to have no void inside thereof and therefore, the heat characteristics of the semiconductor can be improved and the occurrence of the crystal defect can be inhibited. After the crystal defect can be inhibited, the crystal deterioration can be inhibited so that it is possible to inhibit an increase of the operating current, occurrence of kink, dark region (abbreviated as DR), and dark line defect which are attributed to the crystal deterioration. Since the occurrence of the crystal defect can be inhibited, it is made to be possible to have higher output of laser beams. In addition, the semiconductor laser element has a high heat radiation characteristic and therefore, it is possible to enhance high temperature operating performance which allows the semiconductor laser element to operate even in an environment at high temperature.

Further, according to the method of manufacturing the semiconductor laser element 30 of the embodiment, there is formed the protrusion 65 composed of the first removing region 67 to be removed, and the second removing region 68 which is removed in coordination with the first removing region 67. This makes it possible to prevent a remaining part of the protrusion 65, which cannot be removed at the ultrasonic vibration removing step, from being formed when the protrusion 65 is being removed at the ultrasonic vibration removing step. That is, by forming the protrusion 65 composed of the first and second removing regions 67 and 68, the protrusion 65 can be reliably removed from the precursor 60 of the intermediate layer so that the intermediate layer 45 can be formed. Specifically, the first and second removing regions 67 and 68 can be formed by forming the protrusion 65 so as to have 1 μm or more. By forming the first and second removing regions 67 and 68 in this manner, it is possible to remove the protrusion 65 from the precursor of the intermediate layer 45 so that the formation of the intermediate layer 45 can be realized. In this case, the second removing region 68 is a synonym of a region from the base part 66 of the protrusion 65 to a part which is 0.01 μm away in the widthwise length. The first removing region 67 is a synonym of a region of the protrusion 65, which is 0.01 μm outer in the widthwise length. This can realize to manufacture the semiconductor laser element 30 provided with the ridge part 43 which has a continuously or gradually shorter widthwise length along the laminating direction X1, or has a uniform widthwise length. In other words, this can realize to manufacture the semiconductor laser element 30 in which both the widthwise surface parts 48 of the ridge part 43 is formed so as to face the laminating direction X1, or so as to be substantially perpendicular to the laminating direction X1. That is to say, this can realize to manufacture the semiconductor laser element 30 provided with the ridge part 43 which is not formed so as to have an inverse tapered shape.

According to the method of manufacturing the semiconductor laser element 30 of the embodiment, by the precursor forming step and side etching step, it is possible to form the ridge part 43 in which the precursor 60 of the intermediate layer relatively protrudes in the width direction from the third cladding layer 44 and the capping layer 46. This can realize to form, at the protruding step, the ridge part 43 in which the precursor 60 of the intermediate layer relatively protrudes in the width direction from the third cladding layer 44 and the capping layer 46.

Further, according to the method of manufacturing the semiconductor laser element 30 of the embodiment, the intermediate layer 45 is formed so as to have enough layer thickness to inject the holes from the capping layer 46 into the third cladding layer 44 and therefore, it is possible to buffer a barrier formed by bonding the capping layer 46 and third cladding layer 44 which have different forbidden bands, and manufacture the semiconductor laser element 30 in which the current can be reliably flowed from the capping layer 46 to the third cladding layer 44 through the intermediate layer 45 so that the yield ratio can be enhanced.

TABLE 1

| Layer thickness (μm) | Ratio of removing protrusion (%) | Ratio of good-quality product (%) |
|---|---|---|
| 0.01 | 100 | 0 |
| 0.02 | 90 | 70 |
| 0.03 | 80 | 75 |
| 0.05 | 70 | 60 |
| 0.06 | 10 | 20 |

Specifically, as shown in Table. 1, in a case where a layer thickness of the intermediate layer 45 was 0.01 μm, despite 100% of a ratio of removing the protrusion, a ratio of good-quality product became 0% as shown in Table 1 and FIG. 5. The ratio of removing the protrusion indicates a percentage of quantity of the semiconductor laser element 30 in which the protrusion 65 is removed based on a total quantity of the semiconductor laser element 30 to be manufactured. In this case, the intermediate layer could not buffer a discontinuity of the forbidden band of the third cladding layer 44 and the capping layer 46, and the element resistance of the semiconductor laser element 30 increased. As a result, the semiconductor laser element 30 in which a current more than the operating current could not be flowed was manufactured. This made the ratio of the good-quality product of the semiconductor laser element 30 to be 0%. As shown in Table. 1, in a case where the intermediate layer 45 had a layer thickness of 0.06 μm, the ratio of removing the protrusion became 10%. Since a plurality of the semiconductor laser elements having a void between the intermediate layer and the current block layer were manufactured, the ratio of good-quality product of the semiconductor laser element 30 became 20% as shown in Table 1 and FIG. 5. In addition, as shown in Table 1, in a case where the intermediate layer 45 had a layer thickness of 0.02 μm or more and 0.05 μm or less, the removing ratio became 70% or more as well as such a high ratio of good-quality product of the semiconductor laser element 30 of 60% or more. In a case where the intermediate layer 45 had a layer thickness of 0.02 μm or more and 0.05 μm or less as above, the ratio of good-quality product was 60% or more which meant an enhanced yield ratio. On the other hand, in a case where the intermediate layer 45 had a layer thickness of 0.01 μm or less and 0.06 μm or more, the ratio of good-quality product became 20% or less which meant a poor yield ratio. In addition, in a case where the intermediate layer 45 was formed so as to have a layer thickness of 0.01 μm or less, the ridge part 43 was occasionally broken due to too much output to resist when the ultrasonic vibration is given on removing the protrusion 65. Consequently, the intermediate layer 45 preferably has a layer thickness of 0.02 μm or more and 0.05 μm or less. When the intermediate layer 45 is formed so as to have the layer thickness in such a range, it is possible to manufacture the semiconductor laser element 30 in which the current can be reliably flowed from the third cladding layer 44 to the capping layer 46 through the intermediate layer 45 so that the yield ratio can be enhanced.

Further, according to the method of manufacturing the semiconductor laser element 30 of the embodiment, the protrusion 65 can be removed from the precursor 60 of the intermediate layer only by giving the ultrasonic vibration to the precursor 55 of the compound semiconductor multilayer structure and therefore, it is possible to easily realize removal of the protrusion 65.

Further, according to the method of manufacturing the semiconductor laser element 30 of the embodiment, the coating part 64 is formed at precursor forming step and therefore, it is possible to inhibit the etching stop layer 42 from being eroded by the etchant of phosphoric acid type at a side etching step. This makes it possible to reliably prevent the second cladding layer 41 from being eroded by the etchant of phosphoric acid type. This allows manufacturing the semiconductor laser element 30 which can fulfill a desired function. In addition, by forming the coating part 64 in this manner, it is possible to form the precursor 60 of the ridge part by an etching such as a dry etching in which it is difficult to control the etching amount, and to form the ridge part 43 by a wet etching in which it is easy to control the etching amount. This makes it possible to form the ridge part 43 so as to have an accurate shape and size. Thus, the dry etching can form the coating part 64, that is, prevents the second cladding layer 41 from being eroded by leaving the coating part 64, and form the ridge part 43 with accuracy by the wet etching having a favorable controllability.

Each constitution of the semiconductor laser element 30 of the first embodiment is not limited to the above-mentioned shapes and ingredients. The semiconductor laser element 30 needs only to be provided with the ridge part 43 formed therein, that is to be a so-called real refractive index waveguide type semiconductor laser element which fulfills a desired functions. Even if the semiconductor laser element is not the AlGaInP type which is used in the first embodiment as the semiconductor laser element 30, a semiconductor laser element of GaAs type or gallium nitride (GaN) type is also applicable.

Figure 6:
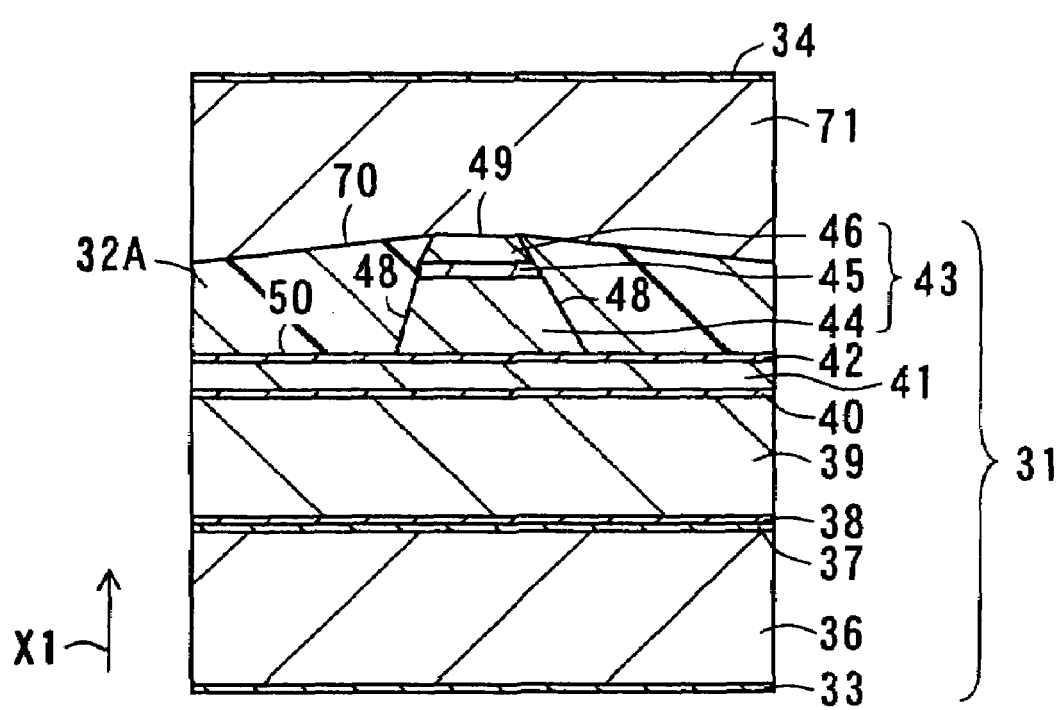
FIG. 6 is a cross sectional view showing a semiconductor laser element according to a second embodiment.

FIG. 6 is a cross sectional view showing a semiconductor laser element 30A according to a second embodiment. The semiconductor laser element 30A has a similar constitution to the semiconductor laser element 30 of the first embodiment. Thus, different points will be described while a description of the same constitution will be omitted by giving the same numerals thereto. The semiconductor laser element 30A is formed so as to have the widthwise surface parts 48 of the ridge part 43 inclined to the laminating direction X1, and the ridge part which has a continuously shorter widthwise length along the laminating direction X1. The third cladding layer 44, the intermediate layer 45 and the capping layer 46 are formed so as to have the widthwise side parts thereof inclined to the laminating direction X1, and the continuously shorter widthwise length along the laminating direction X1. On the current block layer coating part 50, laminated is a current block layer 32A which is formed so as to have a substantially same layer thickness as a laminating directional length of the ridge part 43, that is a height of the ridge part 43. The current block layer 32A is closely laminated without forming a void in the ridge part 43. The surface part 70 facing the laminating direction X1 (occasionally referred to as "a current block layer surface part 70" hereinbelow) is formed so as to have a substantially one surface shape with the ridge exposed surface part 49. The "substantially one surface shape" includes a one surface shape. On the current block layer surface part 70, formed is a contact layer 71 which is disposed in order to provide the ohmic contact with the p-type electrode 34. The contact layer 71 is constituted by, for instance, the p-type GaAs, and laminated so as to coat the current block layer surface part 70 and the ridge exposed surface part 49. The deposition in this manner makes it possible to closely deposit the current block layer 32A and the ridge part 43 without forming a void therebetween, similarly to the current block layer 32 of the first embodiment. The p-type electrode 34 is disposed in the laminating direction on a surface part of the contact layer 71 formed in this manner, which faces the laminating direction. The semiconductor laser element 30A is thus formed. The method of manufacturing the semiconductor laser element 30A having such a constitution will be described.

Figure 8A:
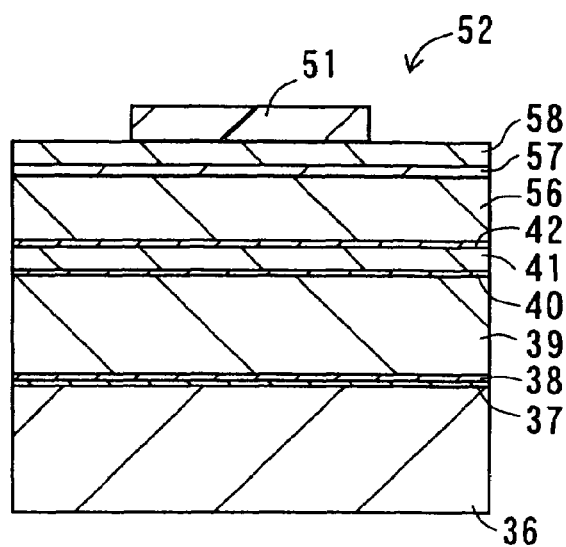
FIGS. 8A to 8H are cross sectional views gradually showing steps of manufacturing the semiconductor laser element.
Figure 8B:
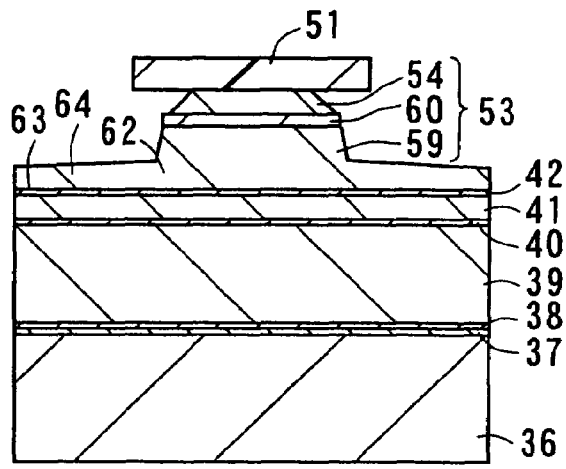
Figure 8C:
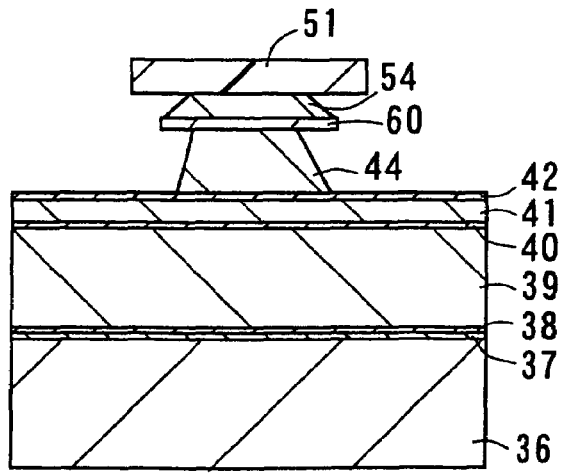
Figure 8D:
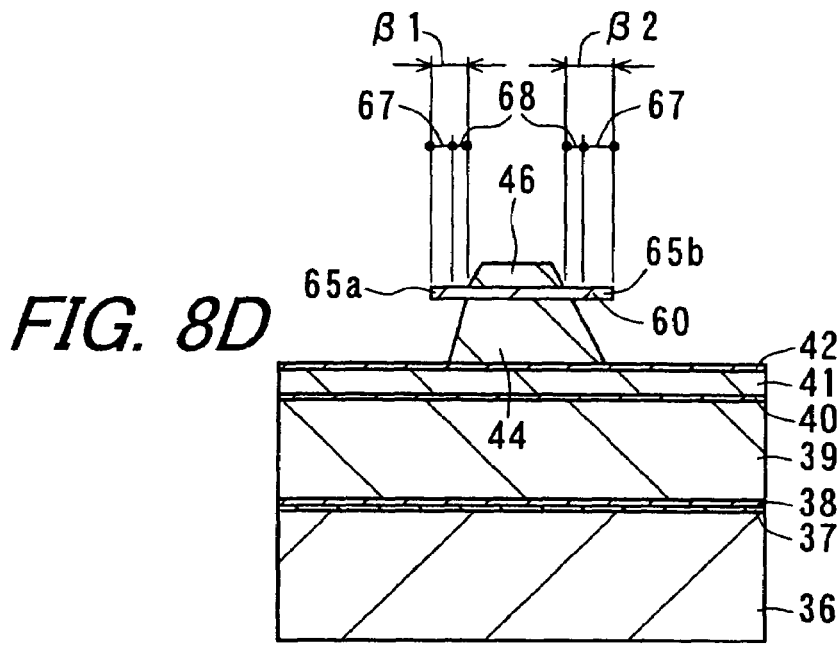
Figure 8E:
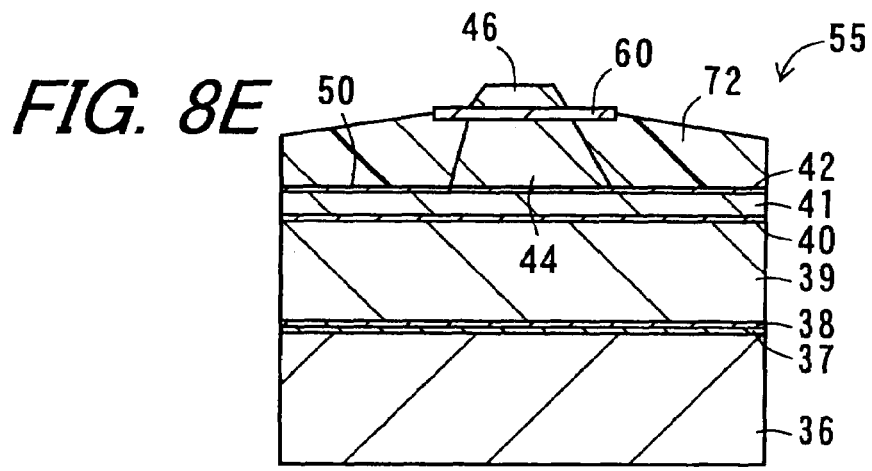
Figure 8F:
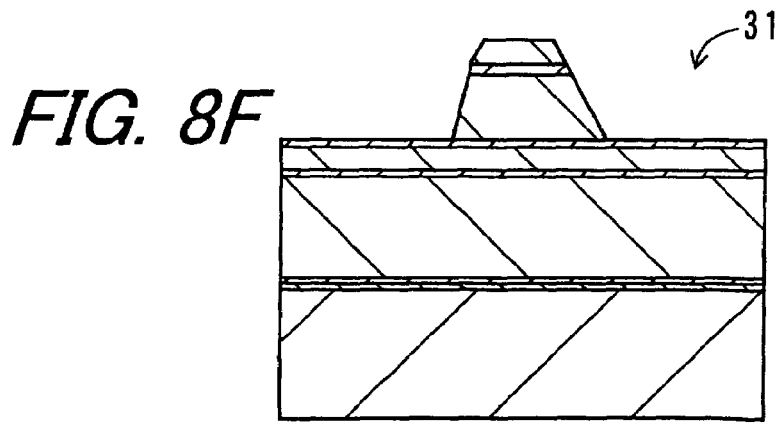
Figure 8G:
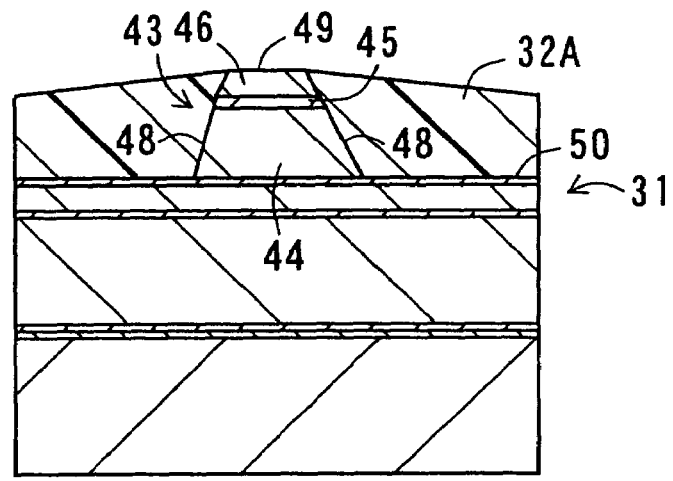
Figure 8H:
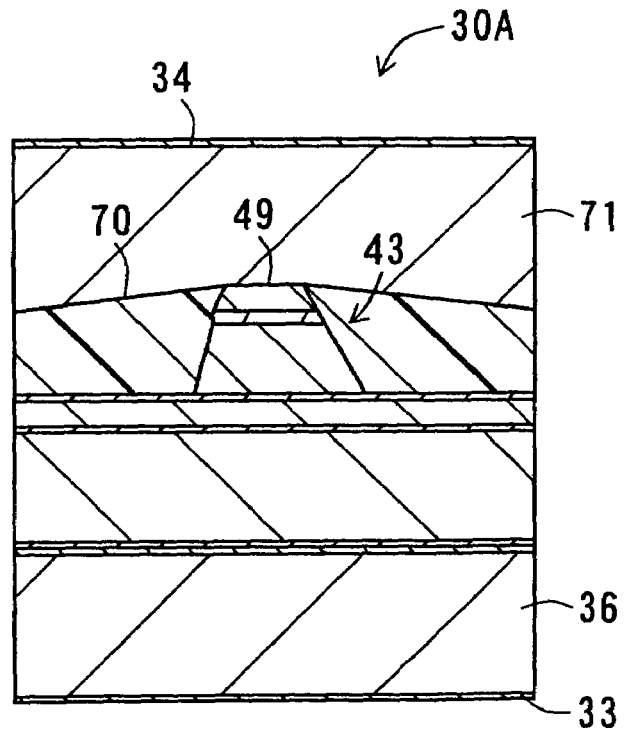
Figure 9:
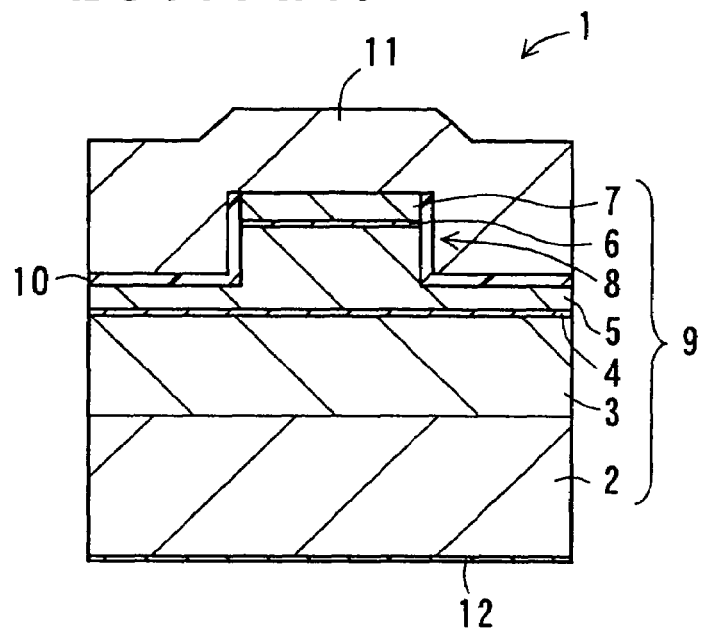
FIG. 9 is a cross sectional view showing a semiconductor laser element of a first related art.
Figure 10:
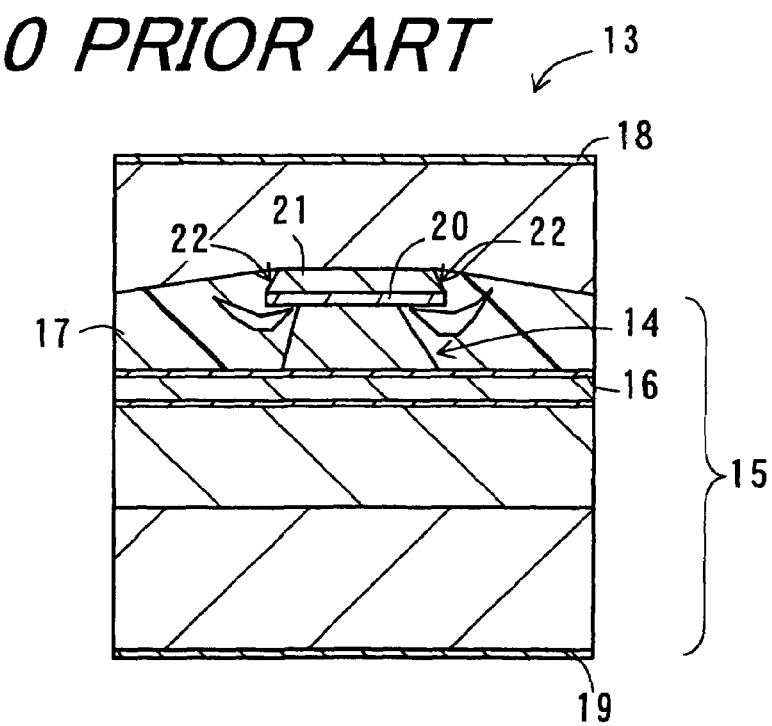
FIG. 10 is a cross sectional view showing a semiconductor laser element of a second related art.
Figure 11:
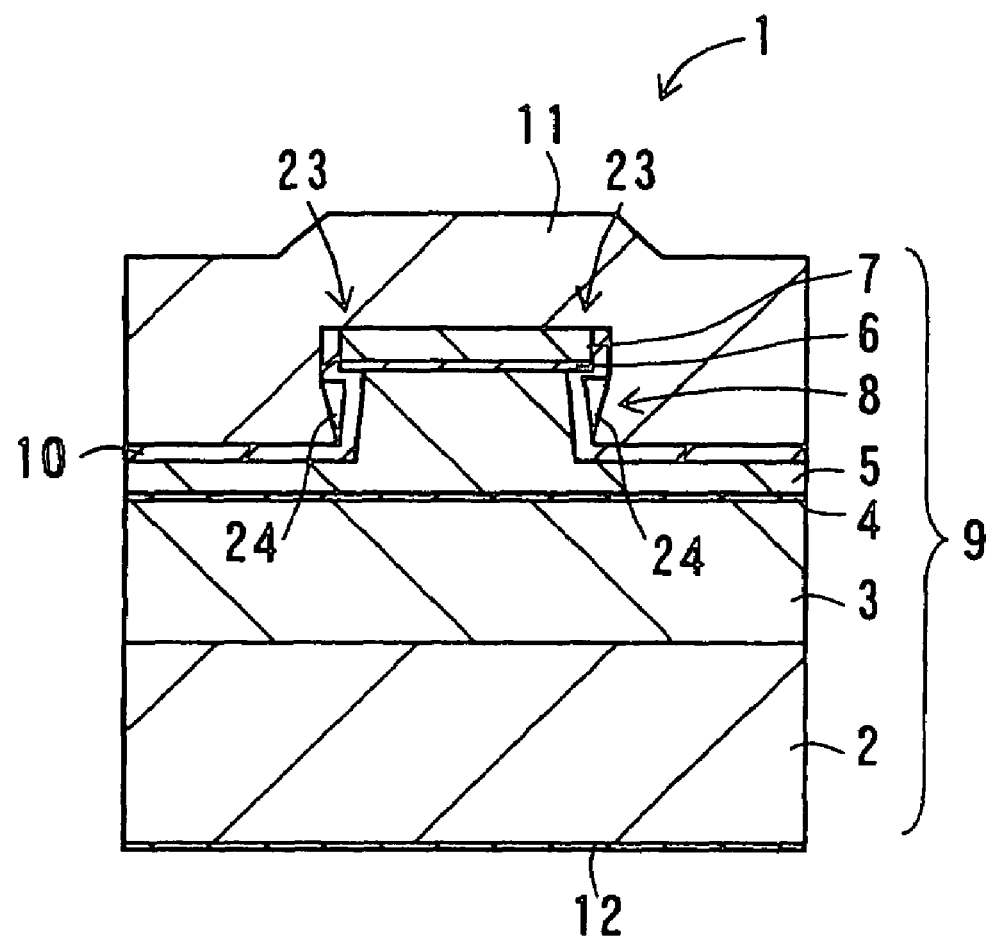
FIG. 11 is a cross sectional view showing a semiconductor laser element of the first related art in a state of having a void inside thereof.

FIG. 7 is a flowchart showing steps of manufacturing the semiconductor laser element 30A. FIGS. 8A to 8H are cross sectional views gradually showing steps of manufacturing the semiconductor laser element 30A. FIG. 8A is a cross sectional view showing the multilayered lamination layer structure 52 having the etching mask 51 formed therein. FIG. 8B is a cross sectional view showing a multilayered lamination layer structure in a state where the precursor 53 of the ridge part is formed. FIG. 8C is a cross sectional view showing a multilayered lamination layer structure in a state where the side etching is performed on the precursor 59 of the third cladding layer. FIG. 8D is a cross sectional view showing the precursor 55 of the compound semiconductor multilayered structure. FIG. 8E is a cross sectional view showing the precursor 55 of the compound semiconductor multilayer structure having a resist 72 laminated thereon. FIG. 8F is a cross sectional view showing the compound semiconductor multilayer structure 31. FIG. 8G is a cross sectional view showing the compound semiconductor multilayer structure 31 having the current block layer 32A laminated thereon. FIG. 8H is a cross sectional view showing the semiconductor laser element 30A. A method of manufacturing the semiconductor laser element 30A is also similar to that of manufacturing the semiconductor laser element 30 of the first embodiment. The different points will be described while description of the same constitutions and steps will be omitted by giving the same numerals thereto. The substrate 36 is mounted on the MOVPE apparatus (not shown) and then, a step of manufacturing the semiconductor laser element starts, and step a0 proceeds to step a1. At step a1, a plurality of the lamination layers are laminated and then, step a1 proceeds to step b2.

At step b2 as a precursor forming step, similarly to step a2 in FIG. 2, the etching mask 51 is formed and then, the wet etching is performed on the third cladding layer 56, the intermediate layer 57, and the capping layer 58 by use of the etchant of sulfuric acid hydrogen peroxide solution type and an etchant of bromine solution type. The etchant of bromine solution type is, for instance, a mixed solution of saturated bromine water, phosphoric acid, and water, which is an etchant capable of performing the wet etching on the precursor 54 of the capping layer, the precursor 60 of the intermediate layer, the precursor 59 of the third cladding layer, and the etching stop layer 42. In the etchant of bromine solution type, an etching speed of GaAs under 20° C. is, for instance, approximately 0.1 μm/min. By performing the wet etching on the multilayered lamination layer structure 52 by use of such etchant, the precursor 53 of the ridge part is formed as shown in FIG. 8B. After the precursor 53 of the ridge part is formed, step b2 proceeds to step b3.

At step b3 as a side etching step, similarly to step a3 in FIG. 2, the etching is firstly performed on the precursor 59 of the third cladding layer by use of the etchant of phosphoric acid type so that the coating part 64 is removed so as to expose the etching stop layer 42. Furthermore, the third cladding layer 44 is formed by the side etching as shown in FIG. 8C. Next, the side etching is performed on the precursor 54 of the capping layer by use of the etchant of sulfuric acid hydrogen peroxide solution type so that the capping layer 46 is formed. By performing the side etching on the precursors 59 and 54 of the third cladding layer and the capping layer in this manner, the third cladding layer 44 and the capping layer 46 are formed. That is to say, as shown in FIG. 8D, the precursor 60 of the intermediate layer can be formed so as to protrude from the third cladding layer 44 and the capping layer 46. In the case, due to surface directions of the third cladding layer 44 and capping layer 46, a protruding amount $\beta 1$ ($\beta 1=0.4$ μm in the embodiment) of an protrusion 65a (occasionally referred to as "a left side protrusion" hereinbelow) protruding in a left direction on a drawing page, and a protruding amount $\beta 2$ ($\beta 2=0.6$ μm in the embodiment) of an protrusion 65b (occasionally referred to as "a right side protrusion" hereinbelow) protruding in a right direction on the drawing page are different. However, the protruding amount is not limited to such values. The protrusion needs only to be removable and the protrusion 65 needs only to be formed so as to include the first and second removing regions. Furthermore, the etching mask 51 disposed on the capping layer 46 is removed after the protrusion 65 is formed. When the etching mask 51 is removed, the precursor 55 of the compound semiconductor multilayer structure is formed and then, step b3 proceeds to step b4.

At step b4 as a removing step as well as a etching removing step, the resist 72 is formed on the etching stop layer 42 by use of the lithography. Specifically, in a state where the third cladding layer 44 and the left and right side protrusions 65a and 65b (these two are occasionally referred to as "an protrusion 65" hereinbelow) are embedded in the resist 72, the resist 72 is formed on the etching stop layer so as to expose only surface part of the protrusion 65, which faces the laminating direction. The resist 72 is thus formed and then, the protrusion 65 is removed by use of the etchant of sulfuric acid hydrogen peroxide solution type. The etchant of sulfuric acid hydrogen peroxide solution type is, for instance, a mixed solution of hydrochloric acid, hydrogen peroxide solution, and water, which is an etchant capable of performing the wet etching on the precursor 60 of the intermediate layer. In this case, the left and right side protrusions 65a and 65b each are formed so as to have protruding amounts of 0.4 μm and 0.6 μm. Consequently, it is possible to reduce a desired accuracy on the lithography so that steps such as development can be stably performed, that is, a large process margin can be secured. When the protrusion 65 is thus removed, the wet etching is performed on the capping layer 46 exposed from the resist 72 by used of the etchant of hydrochloric acid hydrogen peroxide solution type. However, the precursor 60 of the intermediate layer is formed so as to have a layer thickness of 0.05 μm and therefore, an etching amount is equal to substantially zero based on the layer thickness. In order that the capping layer 46 is thus hardly eroded by the etchant of hydrochloric acid hydrogen peroxide solution type, a layer thickness of the protrusion 65, that is, a layer thickness of the intermediate layer 57 is preferably 0.05 μm or less. The protrusion 65 is thus removed by the etching and then, the resist 72 is removed by the lithography. In this manner, as shown in FIG. 8E, the compound semiconductor multilayer structure 31 is formed. After the compound semiconductor multilayer structure 31 is obtained, step b4 proceeds to step b5.

At step b5 as a current block layer forming step, similarly to step a4 in FIG. 2, the crystal growth is made by the MOVPE method on the compound semiconductor multilayer structure 31. The current block layer 32A is laminated so as to have a substantially one surface with the ridge exposed surface part 49. Since the widthwise surface parts 48 of the ridge part 43 is formed so as to face the laminating direction, the current block layer 32A can be closely formed on the ridge part 43 so as to be substantially uniform. In other words, the widthwise surface parts 48 of the ridge part 43 is not formed so as to have the inverse tapered shape towards the laminating direction and therefore, the current block layer 32A can be closely formed on the ridge part 43 so as to be substantially uniform. This makes it possible to form the current block layer 32A on the compound semiconductor multilayer structure 31 without forming a void between the ridge part 43 and the current block layer 32A. The current block layer 32A is thus formed and then, step b5 proceeds to step b6.

At step b6 as an electrode forming step, the contact layer 71 is laminated so as to coat the current block layer 32A and the ridge exposed surface part 49. On the contact layer 71, the p-type electrode 34 is further formed. Furthermore, on the substrate 36, the n-type electrode 33 is formed. By forming the contact layer 71, the p-type electrode 34, the n-type electrode 33 in this manner, the semiconductor laser element 30A is manufactured. After the semiconductor laser element 30A is manufactured, step b6 proceeds to step a7 where the steps of manufacturing method ends.

In the semiconductor laser element 30A thus manufactured, it is possible to form the ridge part 43 from which the removing part 65 can be removed without giving the ultrasonic vibration. The semiconductor laser element 30A provided with the ridge part 43 which is thus formed achieves the same effect as the semiconductor laser element 30 of the first embodiment. In addition, the ingredient and size of the semiconductor laser element 30A is not limited to those in the embodiment, similarly to the semiconductor laser element 30 of the first embodiment.

The semiconductor laser elements 30 and 30A of the first and second embodiments are formed so as to have a continuously or gradually shorter widthwise length of the ridge part 43 along the laminating direction. However, it is also possible to prevent a void from being formed between the ridge part 43, the current block layers 32 and 32A, the p-type electrode 34, and the gold overlaid layer 35, or the contact layer 71 by forming the ridge part 43 so as to have a uniform widthwise length. In this case, it is also possible to gain the same effect of the semiconductor laser elements 30 and 30A of the first and second embodiments.

In the embodiments, the intermediate layer 45, the third cladding layer 44, and the capping layer 46 are formed so as to have substantially uniform widthwise lengths of the surface parts thereof, which face each other. However, there is no such limitation on the formation. For instance, the third cladding layer 44, the intermediate layer 45, and the capping layer 46 can be also formed so as to have different widthwise lengths of the surface parts thereof, which face each other, and the ridge part 43 can be formed so as to have a shorter widthwise length thereof along the laminating direction X1. In this case, the ridge part 43 can also be formed so as to have a stair-like shape by being provided with steps.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method of manufacturing a semiconductor laser element having a ridge part comprising a cladding layer, a capping layer and an intermediate layer therebetween, the method comprising:
    a laminating step of laminating a plurality of lamination layers on a semiconductor substrate in a laminating direction;
    a protruding step of forming, after the laminating step, the cladding layer, the capping layer, and a precursor of the intermediate layer so that widths of the cladding layer and the capping layer become shorter or uniform with the advance in the laminating direction, and the precursor of the intermediate layer protrudes widthwise from the cladding layer and the capping layer by at least 1.0 µm, the intermediate layer having a thickness from 0.02 µm to 0.05 µm; and
    a removing step of removing the protrusion of the precursor of the intermediate layer to form a compound semiconductor multilayer structure,
    wherein the precursor of the intermediate layer comprising a first removing region and a second removing region that is removed in the removing step in coordination with the first removing region.

2. The method of manufacturing a semiconductor laser element of claim 1, wherein the removing step is followed by a coating step of coating the compound semiconductor multilayer structure with an insulating layer.

3. The method of manufacturing a semiconductor laser element of claim 1, wherein the protruding step including:
    a precursor forming step of forming each precursor of the capping layer, intermediate layer, and cladding layer by etching; and
    a side etching step of performing a side etching on each precursor of the cladding layer and capping layer so that the precursor of the intermediate layer is formed so as to protrude widthwise from the cladding layer and capping layer.

4. The method of manufacturing a semiconductor laser element of claim 1, the intermediate layer is formed so as to have enough layer thickness to inject holes from the capping layer into the cladding layer.

5. The method of manufacturing a semiconductor laser element of claim 1, wherein at the removing step, the protrusion is removed by applying ultrasonic vibration to the precursor of the compound semiconductor multilayer structure.

* * * * *